(12) United States Patent  (10) Patent No.: US 6,330,262 B1
Burrows et al.  (45) Date of Patent: Dec. 11, 2001

(54) ORGANIC SEMICONDUCTOR LASERS

(75) Inventors: Paul E. Burrows, Princeton Junction; Stephen R. Forrest, Princeton, both of NJ (US); Mark Thompson, Anaheim, CA (US); Vladimir G. Kozlov, Plainsboro; Gautam Parthasarathy, Princeton, both of NJ (US)

(73) Assignees: The Trustees of Princeton University, Princeton, NJ (US); The University of Southern California, Los Angeles, CA (US)

( * ) Notice: Subject to any disclaimer, the term of this patent is extended or adjusted under 35 U.S.C. 154(b) by 0 days.

(21) Appl. No.: 09/073,843

(22) Filed: May 7, 1998

Related U.S. Application Data (60) Provisional application No. 60/046,061, filed on May 9, 1997.

(51) Int. Cl.[7] ............................................. H01S 3/16
(52) U.S. Cl. .................... 372/39; 372/53; 372/70
(58) Field of Search ................. 372/39, 53, 54, 372/70

(56) References Cited

U.S. PATENT DOCUMENTS

| | | |
|---|---|---|
| 3,818,371 | 6/1974 | Herz et al. . |
| 3,913,033 | 10/1975 | Tuccio et al. . |
| 4,395,769 | 7/1983 | Damen et al. . |
| 5,237,582 | 8/1993 | Moses . |
| 5,307,363 | 4/1994 | Hosaoawa et al. . |
| 5,329,540 | 7/1994 | Lee et al. . |
| 5,343,050 | 8/1994 | Egusa et al. ........................... 257/40 |
| 5,405,710 | 4/1995 | Dodabalapur et al. .............. 428/690 |
| 5,487,080 | 1/1996 | Mukherjee . |
| 5,530,711 | 6/1996 | Scheps . |
| 5,557,626 | 9/1996 | Grodzinski et al. . |
| 5,578,379 | 11/1996 | Stutzmann et al. . |
| 5,701,323 | 12/1997 | Kahr et al. . |
| 5,739,545 | 4/1998 | Guba et al. ............................ 257/40 |
| 6,111,902 | * 8/2000 | Kozlov et al. ......................... 372/39 |

* cited by examiner

Primary Examiner—James W. Davie
(74) Attorney, Agent, or Firm—Kenyon & Kenyon (57) ABSTRACT

Lasers comprising a substrate and a layer of organic material over the substrate. The organic material includes host and dopant materials that result in the laser emission of a desired color when pumped by optical pump energy. Host materials include CBP and tris-(8-hydroxyquinoline) aluminum, which when combined with dopant materials such as coumarin-47, coumarin-30, perylene, rhodamine-6G, DCM, DCM2, and pyrromethane-546 result in the efficient lasing of colors such as blue, green and yellow.

38 Claims, 7 Drawing Sheets

FIG. 1

(CBP)

FIG. 2c (Alq$_3$)

FIG. 2b (DCM)

FIG. 2a

FIG. 2e (Rhodamine 6G)

FIG. 2h (Pyrromethane-546)

FIG. 2g (Perylene)

FIG. 2d (DCM2)

FIG. 2f (Coumarin 47)

ORGANIC SEMICONDUCTOR LASERS

RELATED APPLICATIONS

This application claims the benefit of U.S. Provisional Application No. 60/046,061, filed May 9, 1997.

GOVERNMENT RIGHTS

This invention was made with Government support under Contract No. F49620-92-J-0524 awarded by AFOSR and contract No. DMR-94-00362 awarded by NSF/MRSEC. The government has certain rights in this invention.

FIELD OF THE INVENTION

The present invention relates to the field of light emitting devices, in particular, to organic semiconductor lasers.

BACKGROUND INFORMATION

Interest in organic semiconducting materials driven by the potential application of organic light emitting devices (OLEDs) for full color flat panel displays has led to significant progress in polymer and small molecular weight organic semiconductors. Furthermore, the recent demonstration of lasing action in optically pumped films of small molecular weight organic semiconductors, and the observation of optical gain in conjugated polymers have presented the possibility for realizing electrically-pumped laser devices based on these materials. Unique electronic and optical properties of organic semiconductors make such laser sources a potential alternative to inorganic semiconductor lasers.

Although progress has been made in the field of organic semiconductor lasers (OSLs) based on materials such as tris-(8-hydroxyquinoline) aluminum ($Alq_3$) doped with DCM laser dye for red laser emission (for example, as described in U.S. Ser. No. 05/859,468, filed May 19, 1997, now U.S. Pat. No. 6,111,902 which is incorporated herein by reference), there is still a need for materials for the more efficient and reliable laser emission of colors other than red. For example, the prior art does not offer reliable laser diodes operating in the blue, green and yellow spectral ranges.

SUMMARY OF THE INVENTION

The present invention is directed to organic thin film lasers with high efficiency and very low threshold lasing. Both optically- and electrically-pumped embodiments are disclosed. The lasers of the present invention make use of novel laser materials for the efficient lasing of various colors.

The lasers of the present invention general comprise a substrate and a layer of organic material over the substrate. The organic material includes host and dopant materials that together result in the laser emission of a desired color when pumped by any means, such as by optical or electrical energy.

In some of the embodiments of the present invention, the host material of the organic material comprises carbazole biphenyl ("CBP"). In such embodiments, various dopant materials are used for the lasing of corresponding colors. In one such embodiment, the dopant is coumarin-47, resulting in a lasing wavelength of approximately 460 nm. In another such embodiment, the dopant is perylene, resulting in a lasing wavelength of approximately 485 nm. In yet another such embodiment, the dopant is coumarin-30, resulting in a lasing wavelength of approximately 510 nm.

In other embodiments of the present invention, the host material of the organic materials comprises tris-(8-hydroxyquinoline) aluminum. In one such embodiment, the dopant is rhodamine-6G, resulting in a lasing wavelength of approximately 610–625 nm. In another such embodiment, the dopant is DCM, resulting in a lasing wavelength of approximately 615–660 nm. In another such embodiment, the dopant is DCM2, resulting in a lasing wavelength of approximately 655–700 nm. In yet another such embodiment, the dopant is pyrromethane-546, resulting in a lasing wavelength of approximately 560 nm.

DETAILED DESCRIPTION

Figure 1:
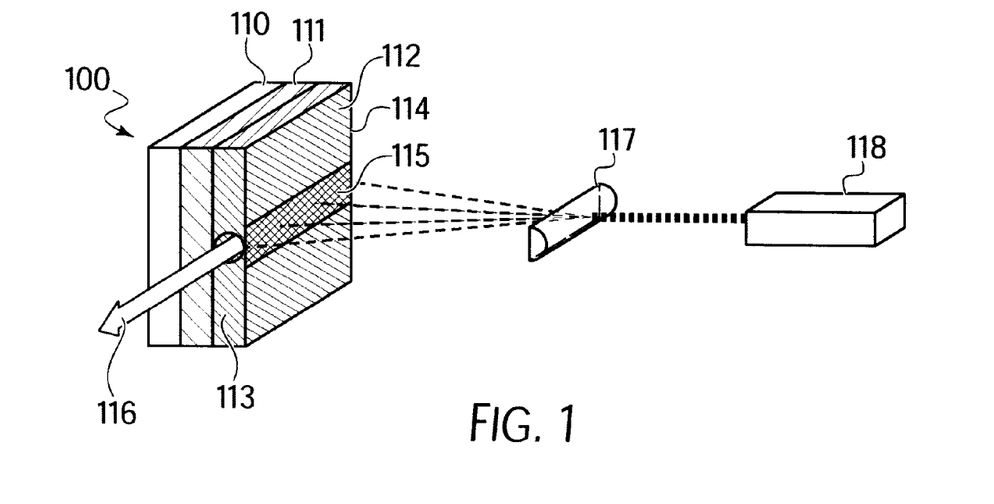
FIG. 1 shows an arrangement including an embodiment of a laser device according to the present invention.
Figure 2A:
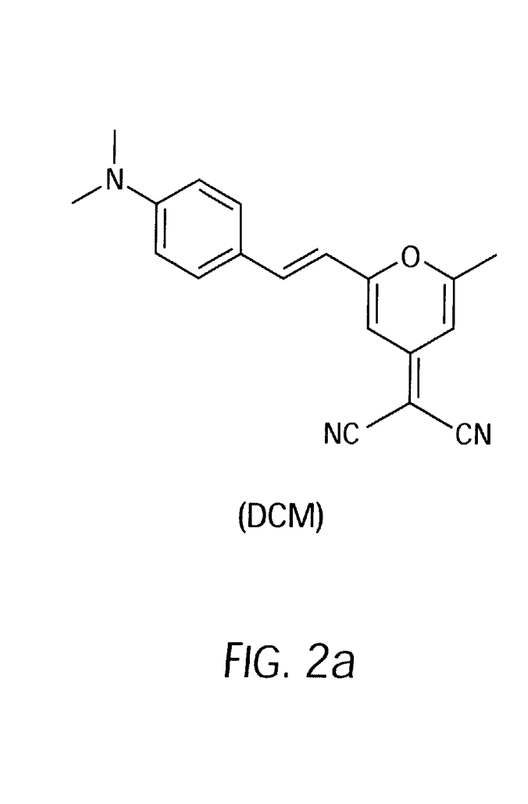
FIGS. 2a–2h show the chemical formulae for DCM, $Alq_3$ CBP, DCM2, rhodamine-6G, coumarin-47, perylene, and pyrromethane-546, respectively.
Figure 2B:
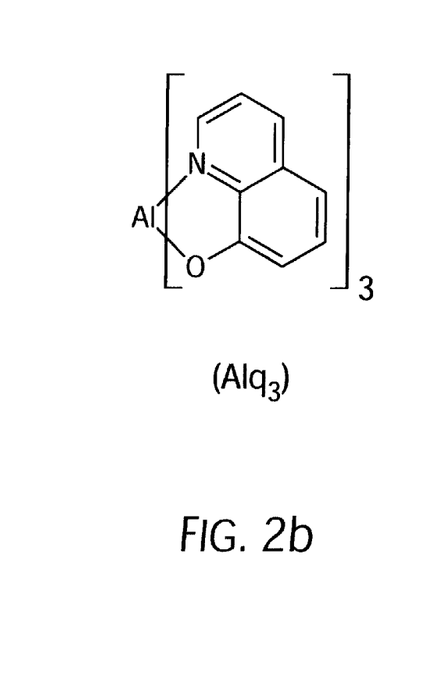
Figure 2C:
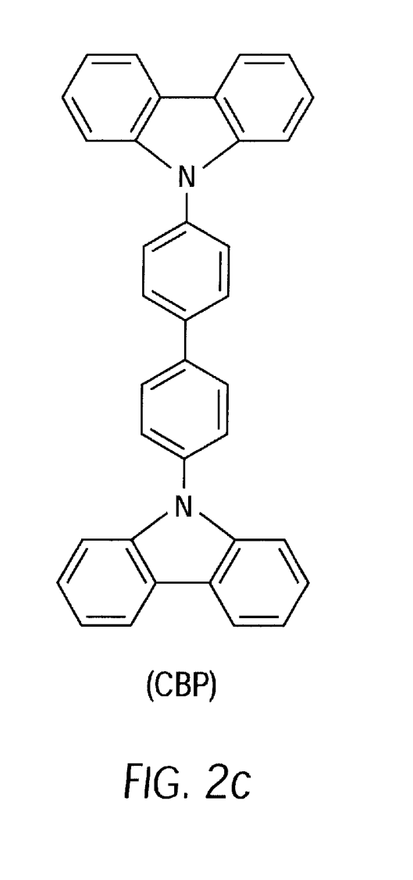
Figure 2D:
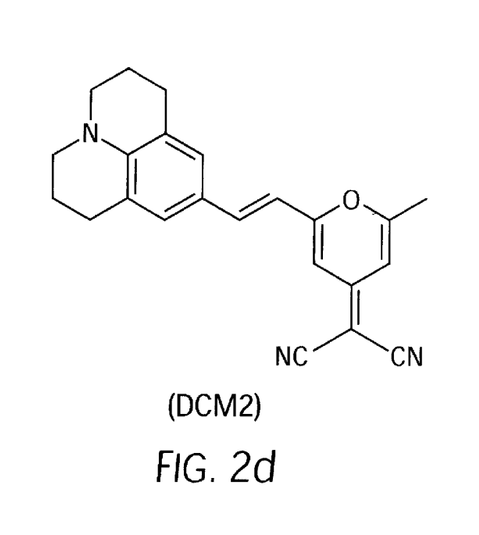
Figures 2E, 2G, 2H:
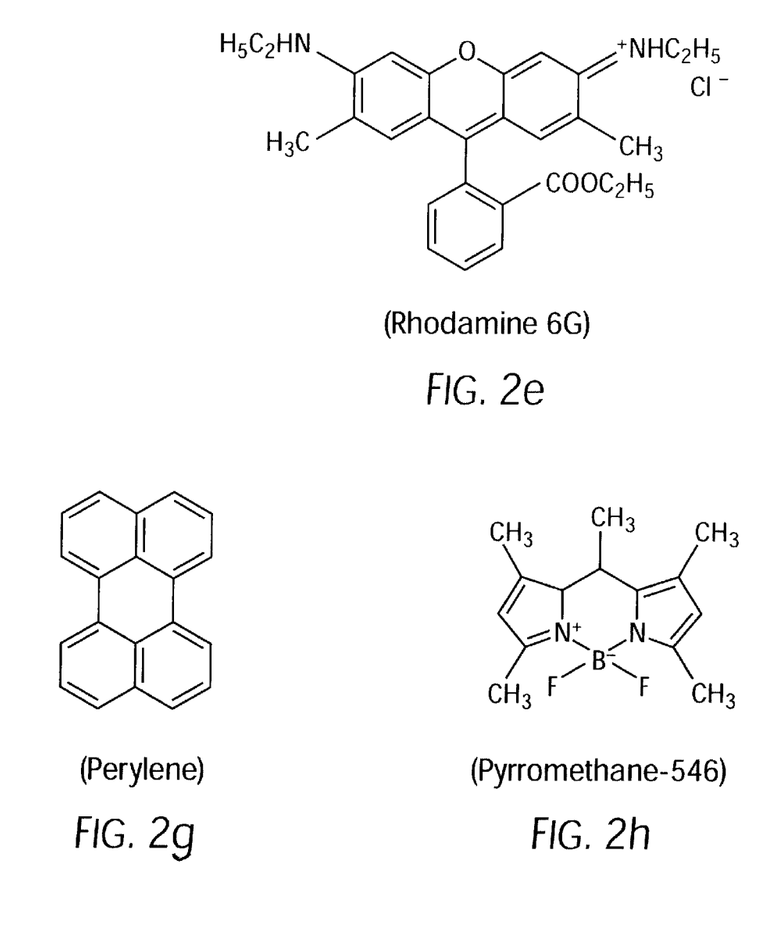
Figure 2F:
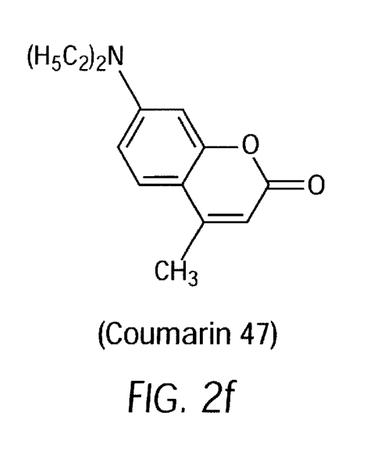

The general structure of the optically-pumped OSL device 100 of the present invention is shown in FIG. 1. The OSL device 100 includes a substrate 110 and a waveguiding layer 112 of organic material 112. The organic material of layer 112 includes host and dopant materials, which are deposited by any suitable technique onto substrate 110. The substrate 110 is optionally pre-coated with a cladding layer 111 comprising a material having an index of refraction less than the organic material of layer 112. The cladding layer 111 may not be required, for example, where the substrate 110 is transparent for laser emission. When the layer 112 is pumped with optical pump energy from a source such as a nitrogen laser 118, the OSL device 100 produces laser beam 116 of a predetermined color.

To facilitate efficient lasing, one of the desired properties of OSL materials used in layer 112 is the efficient energy transfer between host and dopant organic materials. For this to occur the emission spectrum of the host must overlap with the absorption spectrum of the dopant. For example, CBP, having a peak emission at $\lambda=400$ nm, is preferably used as host material for dopants having strong absorption peaks also at about $\lambda=400$ nm. The result is that the optical pump energy is absorbed by the CBP materials within layer 112. This energy is non-radiatively transferred by a dipole-dipole transition to the dopant materials. Because the energy transfer shifts the emission away from the absorption band of the material, it leads to low lasing thresholds and extends the operational lifetime of the OSL.

Some of the embodiments of the present invention make use of CBP as the organic host material. When doped with suitable dye materials, the CBP is used to cause the efficient laser emission of various colors. For example, CBP doped with coumarin-47, perylene and coumarin-30 lases at approximately 450, 490, and 510 nm, respectively. Other embodiments of the present invention make use of tris-(8-hydroxyquinoline) aluminum ("Alq$_3$") as organic host material. For example, Alq$_3$ doped with rhodamine-6G, DCM, DCM2, and pyrromethane-546 lases at approximately 610, 615–660, 655–700, and 560 nm respectively. The formulae for the chemicals known as DCM (Exciton Inc. of Dayton, Ohio), Alq$_3$, CBP, DCM2 (Exciton Inc. of Dayton, Ohio), rhodamine-6G, coumarin-47, perylene and pyrromethane-546 are shown in FIGS. 2a–2h, respectively. The organic materials used in the present invention are deposited by any suitable technique, such as by vacuum thermal evaporation.

Layers 111 and 112 are of any suitable thickness. By way of example, layers 111 and 112 in the embodiment shown in FIG. 1 are approximately 2 $\mu$m and 120 nm, respectively. The thickness of the cladding layer 111 is preferably chosen to provide optical isolation of the waveguiding layer 112 from the opaque substrate 110. The thickness of the layer 112 is chosen to provide uniform pumping and to optimize the ability of the layer to function as an optical waveguide between the cladding layer 111 and the surrounding environment. For example, when layer 112 comprises CBP, a thickness of 120 nm results in approximately 60% absorption of pump energy and a waveguiding confinement factor of approximately 59% at $\lambda$=485 nm. To further facilitate the waveguiding capability of layer 112, cladding layer 111 has an index of refraction less than layer 112 and serves to increase optical confinement in layer 112 in the direction normal to the surface of the device. To yet further facilitate the waveguiding capability of layer 112, the cladding layer 111 comprises SiO$_2$ (having a refractive index, "n" of about 1.5) when the layer 112 comprises CBP as host organic material (n~1.8). In addition, layer 112 preferably includes two reflective facets 113 and 114 that are substantially parallel to each other, thereby forming an optical resonator in layer 112.

Layers 111 and 112 are deposited onto substrate 110 by any suitable technique, such as by plasma enhanced chemical vapor deposition and vacuum thermal evaporation, respectively. The concentration of the dopant in the layer 112 is typically less than 10% by mass, but can be as low as 0.01%. It is generally preferred that layer 112 is deposited by thermal co-evaporation of host and dopant materials at a respective mass ratio of approximately 100:1.

The laser devices of the present invention are grown on any substrate to which the organic layer 112 will adhere and which has a lower index of refraction (n) than the organic layer material. Acceptable substrates include plastics, glass and silicon coated with SiO$_2$. A preferred substrate is polished InP. A typical length for a device in accordance with the present invention is 5 mm, although devices of shorter length, such as 0.5 mm, are possible.

The formation of optically smooth, sharp facets 113 and 114 at opposing edges of the layer 112 is a natural advantage of vacuum-deposited films. The shape of the facets 113 and 114 mimic the shape of the corresponding facets of the underlying substrate 110. As such, it is important that the sides of the substrate 110 be smooth and parallel to each other. Facet reflectivities of 7% are obtained via vacuum deposition of layer 112, which is sufficient to provide the necessary optical feedback. Optical feedback is also achieved with other structures, such as an optical grating placed underneath the optically pumped region of the organic film to thereby form a distributed feedback structure. As an alternative to forming the facets 113 and 114 by vacuum-deposition of layer 112, layer 112 can be deposited onto the substrate 110 by any other suitable method, and the combination is then cleaved to form smooth, sharp facets.

The device 100 of the present invention is optically pumped using any light source emitting light of sufficient intensity which can be absorbed by the host material molecular species of layer 112. In the exemplary embodiment of FIG. 1, the device 100 is optically pumped using a nitrogen laser 118 which generates 500 psec pulses with a wavelength of 337 nm at a 50 Hz repetition rate. As shown in FIG. 1, the pump beam is focused, such as by a cylindrical lens 117, into a stripe 115 on the film surface oriented orthogonal to the facets 113 and 114. The width of the stripe 115 is any suitable dimension, such as 100 $\mu$m, for example. The pump beam is waveguided in layer 112, thereby producing laser beam 116, which is emitted from the facet 113 and/or 114 of the device 100.

Figure 3:
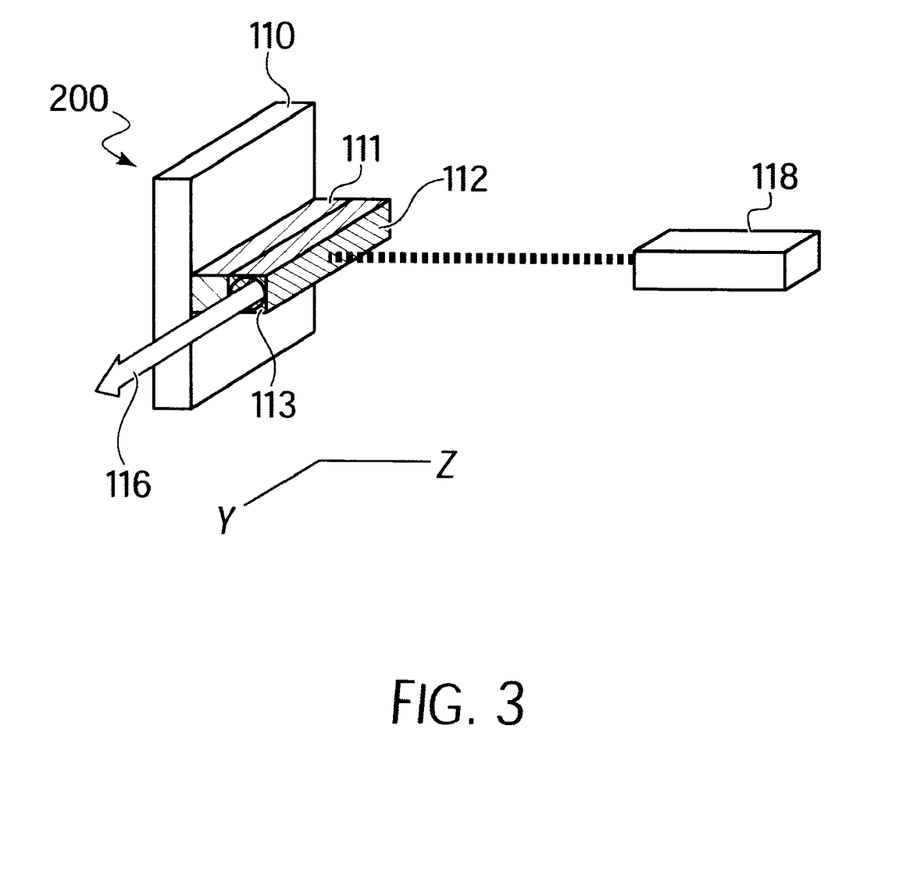
FIG. 3 shows an arrangement including an embodiment of a laser device according to the present invention.

FIG. 3 shows an embodiment 200 of an optically-pumped laser in accordance with the present invention in which it is not necessary to form stripe 115 on layer 112. In this embodiment, the layer 111 forms a ridge on the substrate 110 on which the layer 112 of organic material is deposited. In this embodiment, the optical mode is thus confined in both the z- and y-directions. The width of the layers 111 and 112 should preferably be narrow enough to support only a single lateral optical mode (e.g., 1–10 $\mu$m). The thickness of the active organic layer 112 should be approximately equal to the reciprocal of the absorption coefficient of the host material at the wavelength of the light with which the device is pumped. If a reflective layer (not shown) is placed between the layer 111 and the substrate 110, the thickness of the organic layer 112 should be approximately half the reciprocal of the absorption coefficient of the host material at the wavelength of the light with which the device is pumped. To protect the laser device of FIG. 3, the device is optionally overcoated with a transparent material (not shown) whose index of refraction is lower than that of the layer 112.

Figure 4:
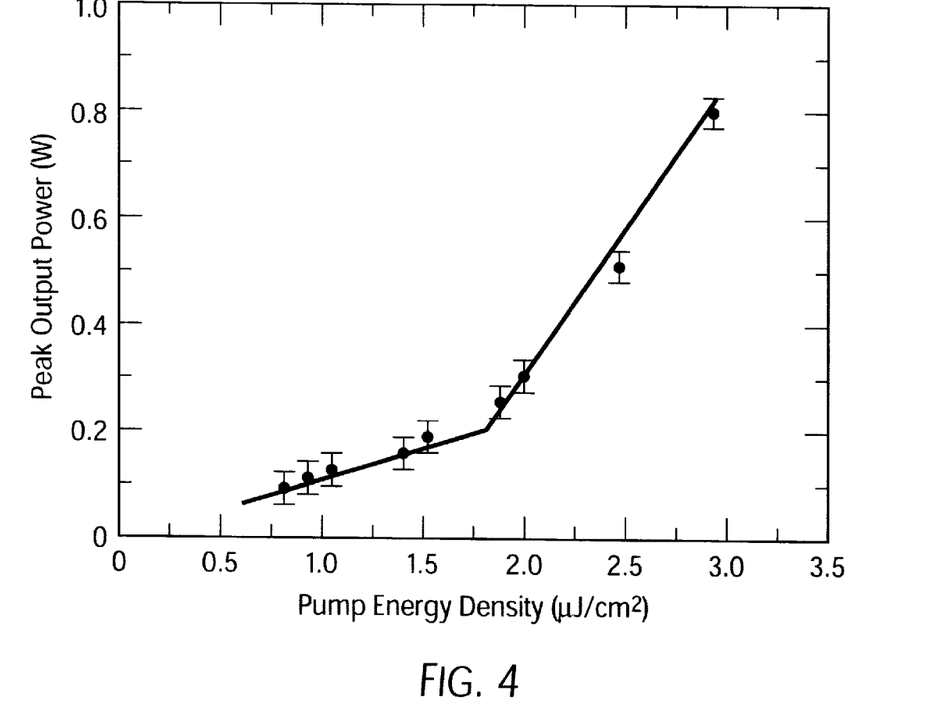
FIG. 4 is a graphical representation of the relationship between peak output power and pump energy density for an embodiment of the present invention.

An example of the dependence of the peak output power of device 100 to the pump energy density is shown in FIG. 4. From this relationship, the lasing threshold is clearly discerned. Each line segment in the graph of FIG. 4 is a linear fit to empirically measured points. The slopes of the two line segments emphasize a change in differential quantum efficiency, from 0.2% (below the lasing threshold) to 10% (above the lasing threshold). It is to be noted, however, that measured differential quantum efficiencies represent a considerable underestimation since the lasing region in an optically pumped gain-guided device is only a small fraction of the material which is being pumped. Hence, most of the pump power is lost in non-lasing regions. The differential quantum efficiency decreases to 7% at excitation levels above 10 $\mu$J/cM$^2$ (not shown), corresponding to peak output powers exceeding 4 W.

Figure 5:
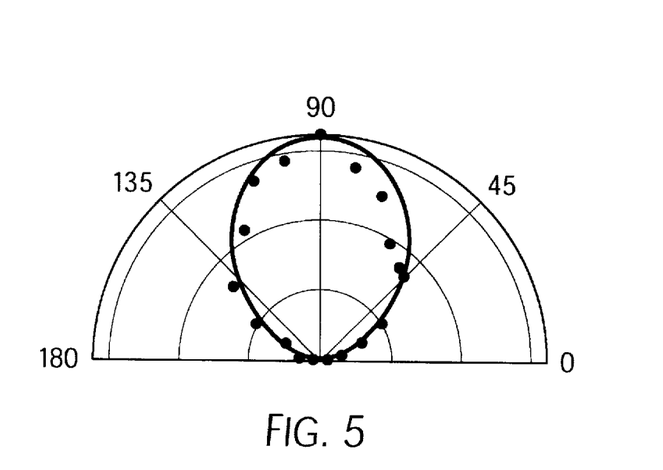
FIG. 5 shows the polarization of the emission of an embodiment of the present invention, as a function of the angle between a plane orthogonal to the film surface and the plane of a polarizer.

FIG. 5 shows the intensity of the emission from an embodiment of the present invention, as passing through a polarizer as a function of angle between the plane orthogonal to the film surface and the plane of the polarizer. The emission is strongly linearly polarized, as is expected for laser emission. The degree of polarization measured is 15 dB, although it should be noted that this result is limited by the measurement arrangement. The solid line, which is a fit of the empirically measured points, follows $\sin^2(\alpha)$, where $\alpha$ is the polarizer angle.

In addition to the optically-pumped embodiments discussed above, the present invention also provides electrically-pumped organic semiconductor laser embodiments. Such embodiments make use of electroluminescent materials that emit light when excited by electric current.

Figure 6A:
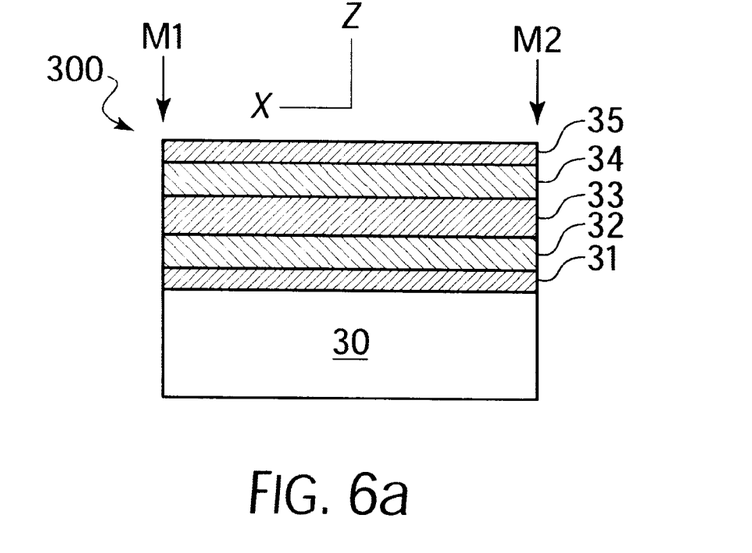
FIGS. 6a and 6b show electrically-pumped laser device embodiments of the present invention.

FIG. 6a shows a cross-sectional view of an electrically-pumped laser device embodiment of the present invention. Device 300 includes a bottom electrode 31, a bottom cladding layer 32, an organic active layer 33, a top cladding layer 34 and a top electrode 35, which are deposited in sequence over a substrate 30. The degree of optical confinement in the active layer 33 depends on factors such as the indices of refraction of the cladding layers 32 and 34.

The active layer 33 comprises any suitable organic electroluminescent material, such as doped $Alq_3$. Either one of the cladding layers 32, 34 is composed of a hole conducting material, such as $MgF_2$ doped with TPD. To get good hole mobility, a 10% concentration of TPD will suffice. The other one of the cladding layers is composed of an electron conducting material, such as $Alq_3$ or $MgF_2$ doped with $Alq_3$. For either cladding layer 32 or 34, the $MgF_2$ can be replaced with another alkali halide such as LiF, KF or KI or with a transparent, low index of refraction, conducting organic material. Electrons and holes are injected into the active layer 33 where the energy is transferred from the conducting host material to the dopant materials, which emit light.

An optical resonator is formed by the edges of the film, i.e., mirror facets M1 and M2. At least one of the electrodes 31 and 35 is patterned into a stripe oriented in the x-direction. That portion of the active material which is electrically pumped experiences a change in optical gain, thus forming a waveguide in the lateral direction (i.e., the gain-guiding effect).

In the electrically-pumped laser device of the present invention, the index of refraction of the active layer 33 is preferably higher than that of the cladding layers 32 and 34. This ensures that most of the mode overlaps with the gain layer. Preferably, the indices of refraction of the cladding layers 32 and 34 should be substantially equal to provide optimal optical confinement.

The cladding layers 32 and 34 should be thick enough to substantially prevent absorption of the optical mode at the electrodes 31 and 35 and to allow for efficient current injection. The thicknesses of the cladding layers can be determined in a known manner. For single-mode operation, the thickness of the active layer 33 should be substantially equal to the lasing wavelength divided by twice the index of refraction of the active layer. For higher modes, the thickness of the active layer 33 should be accordingly greater.

Optical confinement is also achieved by photo-bleaching the active layer 33 to define a waveguide in the active layer. Using this technique, once the active layer 33 has been deposited, a photomask is applied which partially covers the active layer 33 and the layer is exposed to intense UV light in an $O_2$ environment. The unmasked portions of the active layer 33 are thus bleached, lowering their index of refraction. The masked portion of the active layer 33 retains its original, higher index of refraction and is thus optically confined in a lateral direction.

Optical confinement is also achieved by patterning the substrate or bottom cladding layer to achieve index guiding. For example, photo-bleaching can be used on the bottom cladding layer 32 to create an index modulated distributed Bragg reflector under the active layer 33.

An optical resonator is optionally formed in the z-direction. In this case, the top and bottom electrodes also serve as optical mirrors, or, if the electrodes are transparent to light, high reflectivity mirrors can be added on both sides of the structure. The maximum of the optical mode of this structure should spatially match the position of the optical layer. Furthermore, the wavelength of the optical mode should overlap with the gain spectrum of the dopant material.

Figure 6B:
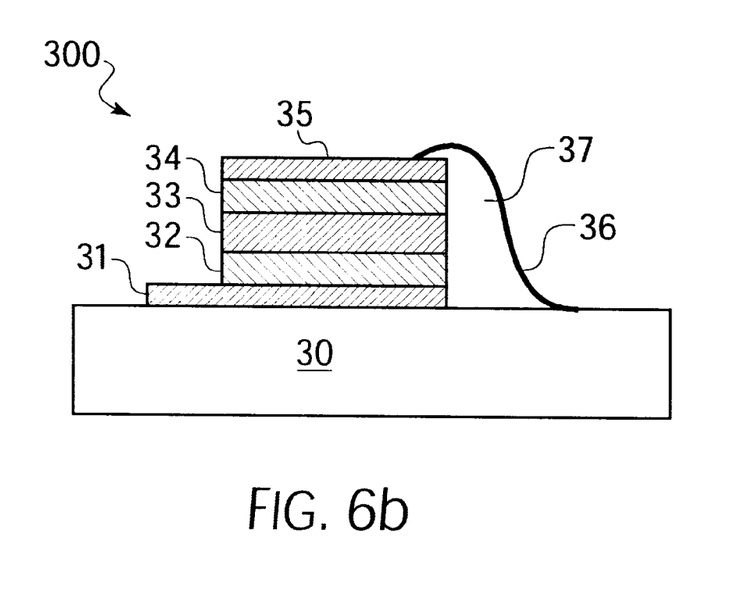

FIG. 6b shows a further embodiment of an electrically-pumped laser device in accordance with the present invention. In this embodiment, the bottom electrode 31 extends beyond the laser structure so as to provide a contact surface. Additionally, an insulator 37 is provided on a side of the laser structure and a contact 36 extending from the upper electrode 35 to the surface of the substrate 30 is deposited on the insulator.

The present invention is further described with reference to the following non-limiting examples.

EXAMPLE 1

An OSL was formed by vacuum-depositing a 120 nm organic film containing perylene-doped CBP onto the (100) crystallographic surface of a polished InP substrate. The substrate was pre-coated with a 2 $\mu$m layer of $SiO_2$, deposited by plasma enhanced chemical vapor deposition. The OSL was optically pumped with 500 psec pulses generated by a nitrogen laser at $\lambda$=337 nm, with a 50 Hz repetition rate. The pump beam was focused onto a 50 $\mu$mm width region on the organic film to form the gain region.

Figure 7:
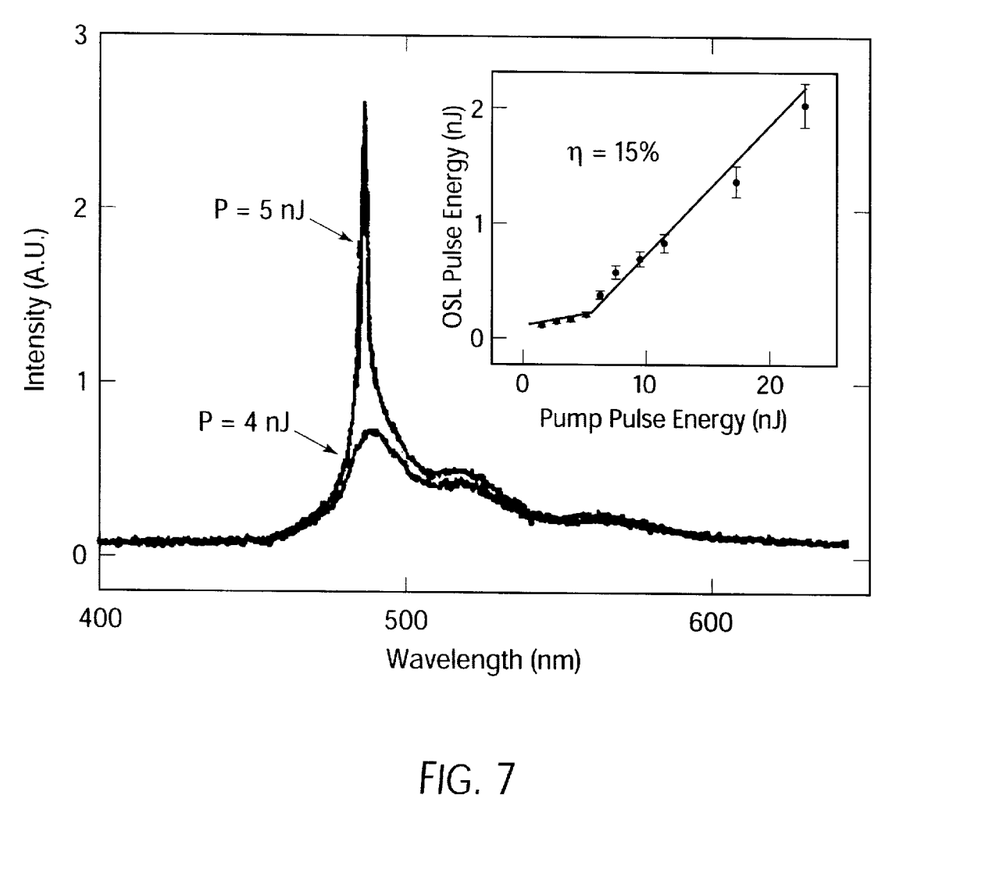
FIG. 7 shows emission spectra for an optically-pumped laser device, in accordance with an embodiment of the present invention.

FIG. 7 shows the edge emission spectra of the optically-pumped OSL at pump levels below (4 nJ) and just above the threshold (5 nJ). Lasing appears as a spectrally narrow (2 nm, FWHM) peak at $\lambda$=485 nm. The inset in FIG. 7 shows the output pulse energy of the OSL as a function of pump pulse energy, clearly indicating the presence of a lasing threshold at a pump pulse energy of 5 nJ (which corresponds to an energy density of 5 $\mu J/cm^2$. Moreover, the OSL exhibited an operational lifetime in excess of $10^5$ laser pulses.

EXAMPLE 2

An OSL was formed by vacuum-depositing an organic film containing coumarin-47-doped CBP onto the (100) crystallographic surface of a polished InP substrate. The substrate was pre-coated with a 2 $\mu$m layer of $SiO_2$, deposited by plasma enhanced chemical vapor deposition. The OSL was optically pumped with 500 psec pulses generated by a nitrogen laser at $\lambda$=337 nm, with a 50 Hz repetition rate. The pump beam was focused onto a 50 $\mu$m width region on the organic film to form the gain region.

The optically-pumped OSL resulted in a lasing wavelength of approximately 455 nm and a lasing threshold of 15 $\mu J/cm^2$. Moreover, the OSL exhibited an operational lifetime on the order of $10^3$ laser pulses.

EXAMPLE 3

An OSL was formed by vacuum-depositing an organic film containing coumarin-30-doped CBP onto the (100) crystallographic surface of a polished InP substrate. The substrate was pre-coated with a 2 $\mu$m layer of $Sio_2$, deposited by plasma enhanced chemical vapor deposition. The OSL was optically pumped with 500 psec pulses generated by a nitrogen laser at $\lambda$=337 nm, with a 50 Hz repetition rate. The pump beam was focused onto a 50 $\mu$m width region on the organic film to form the gain region.

The optically-pumped OSL resulted in a lasing wavelength of approximately 510 nm and a lasing threshold of 13 $\mu J/cm^2$. Moreover, the OSL exhibited an operational lifetime on the order of $10^2$ laser pulses.

EXAMPLE 4

An OSL was formed by vacuum-depositing an organic film containing DCM2-doped $Alq_3$ onto a polished InP substrate. The substrate was pre-coated with a 2 $\mu$m layer of $SiO_2$, deposited by plasma enhanced chemical vapor deposition. The OSL was optically pumped with 500 psec pulses generated by a nitrogen laser at $\lambda$=337 nm, with a 50 Hz repetition rate.

The optically-pumped OSL resulted in a lasing wavelength of approximately 670 nm and a lasing threshold of 2.5 $\mu$J/cm$^2$. Moreover, the OSL exhibited an operational lifetime in excess of $10^6$ laser pulses and a differential quantum efficiency of approximately 30%.

EXAMPLE 5

An OSL was formed by vacuum-depositing an organic film containing DCM-doped $Alq_3$ onto a polished InP substrate. The substrate was pre-coated with a 2 $\mu$m layer of $SiO_2$, deposited by plasma enhanced chemical vapor deposition. The OSL was optically pumped with 500 psec pulses generated by a nitrogen laser at $\lambda$=337 nm, with a 50 Hz repetition rate.

The optically-pumped OSL resulted in a lasing wavelength of approximately 650 nm and a lasing threshold of approximately 3 $\mu$J/cm$^2$. Moreover, the OSL exhibited an operational lifetime in excess of $10^6$ laser pulses and a differential quantum efficiency of approximately 30%.

The subject invention as disclosed herein may be used in conjunction with co-pending applications: "Organic Semiconductor Laser", Ser. No. 08/859,468 (filed May 19, 1997); and "Organic Vertical-Cavity Surface-Emitting Laser", Ser. No. 09/010,594 (filed Jan. 22, 1998)now U.S. Pat. No. 6,160,828, both of which are incorporated herein by reference.

The present invention provides for organic lasers with desired properties and unique wavelength emission. Those with skill in the art may recognize various modifications to the embodiments of the invention described and illustrated herein. Such modifications are meant to be covered by the spirit and scope of the appended claims.

What is claimed is:

1. A laser comprising:
   a substrate; and
   a layer of organic material over said substrate, said organic material comprising CBP; wherein
   said organic material lases when pumped to thereby produce laser light.

2. The laser of claim 1, wherein said CBP is doped with a dye.

3. The laser of claim 2, wherein said dye comprises coumarin.

4. The laser of claim 3, wherein said coumarin comprises coumarin-47.

5. The laser of claim 3, wherein said coumarin comprises coumarin-30.

6. The laser of claim 2, wherein said dye comprises perylene.

7. The laser of claim 1, further comprising a source of optical pump energy to pump said organic material.

8. The laser of claim 7, wherein said source of optical pump energy comprises a nitrogen laser.

9. The laser of claim 1, wherein said substrate comprises InP.

10. The laser of claim 9, wherein said layer of organic material is deposited onto the (100) crystallographic plane of said InP.

11. The laser of claim 1, further comprising a cladding layer between said substrate and said layer of organic material, said cladding layer comprising a material having an index of refraction less than said organic material.

12. The laser of claim 11, wherein said cladding layer comprises $SiO_2$.

13. The laser of claim 1, wherein said layer of organic material includes two reflective facets substantially parallel to each other, thereby forming an optical resonator.

14. The laser of claim 1, further comprising
   a first electrode between said substrate and said layer of organic material; and
   a second electrode over said layer of organic material.

15. The laser of claim 14, wherein said organic material is electroluminescent such that it is pumped when an electric current is passed between said first electrode and said second electrode.

16. The laser of claim 1, wherein said substrate is wider than said layer of organic material.

17. A laser comprising:
   a substrate; and
   a layer of organic material over said substrate, said organic material comprising tris-(8-hydroxyquinoline) aluminum.

18. The laser of claim 17, wherein said tris-(8-hydroxyquinoline) aluminum is doped with a dye.

19. The laser of claim 18, wherein said dye comprises rhodamine-6G.

20. The laser of claim 18, wherein said dye comprises DCM.

21. The laser of claim 18, wherein said dye comprises DCM2.

22. The laser of claim 18, wherein said dye comprises pyrromethane-546.

23. The laser of claim 17, further comprising a source of optical pump energy to pump said organic material.

24. The laser of claim 23, wherein said source of optical pump energy comprises a nitrogen laser.

25. The laser of claim 17, wherein said substrate comprises InP.

26. The laser of claim 25, wherein said layer of organic material is deposited onto the (100) crystallographic plane of said InP.

27. The laser of claim 17, further comprising a cladding layer between said substrate and said layer of organic material, said cladding layer comprising a material having an index of refraction less than said organic material.

28. The laser of claim 27, wherein said cladding layer comprises $SiO_2$.

29. The laser of claim 17, wherein said layer of organic material includes two reflective facets substantially parallel to each other, thereby forming an optical resonator.

30. The laser of claim 17, further comprising
   a first electrode between said substrate and said layer of organic material; and
   a second electrode over said layer of organic material.

31. The laser of claim 30, wherein said organic material is electroluminescent such that it is pumped when an electric current is passed between said first electrode and said second electrode.

32. The laser of claim 17, wherein said substrate is wider than said layer of organic material.

33. A laser comprising:
   a substrate and a layer of organic material over said substrate;
   wherein said layer of organic material includes a dopant material and, wherein said laser emits blue light.

34. A laser comprising:

a substrate and a layer of organic material over said substrate;
 wherein said layer of organic material includes a dopant material, and wherein said laser emits blue light.

35. A laser comprising:

a substrate and a layer of organic material over said substrate;
 wherein said layer of organic material includes a dopant material, and wherein said laser emits yellow light.

36. A laser comprising:

a substrate; and a layer of organic material over said substrate, said organic material lases when pumped to thereby produce laser light;
 wherein said layer of organic material includes a dopant material, and wherein said laser emits blue light.

37. A laser comprising:

a substrate; and a layer of organic material over said substrate, said organic material lases when pumped to thereby produce laser light;
 wherein said layer of organic material includes a dopant material, and wherein said laser emits green light.

38. A laser comprising:

a substrate; and a layer of organic material over said substrate, said organic material lases when pumped to thereby produce laser light;
 wherein said layer of organic material includes a dopant material, and wherein said laser emits yellow light.

* * * * *

UNITED STATES PATENT AND TRADEMARK OFFICE
CERTIFICATE OF CORRECTION

PATENT NO. : 6,330,262 B1
DATED : December 11, 2001
INVENTOR(S) : Burrows et al.

It is certified that error appears in the above-identified patent and that said Letters Patent is hereby corrected as shown below:

Column 4,
Line 64, change "a" to -- $\alpha$ --;

Column 6,
Line 26, change "50 $\mu$mm" to -- 50 $\mu$m --; and

Column 9,
Line 5, change "blue" to -- green --.

Signed and Sealed this

Third Day of September, 2002

*Attest:*

JAMES E. ROGAN
*Director of the United States Patent and Trademark Office*

*Attesting Officer*